United States Patent [19]
Shin et al.

[11] Patent Number: 6,104,095
[45] Date of Patent: Aug. 15, 2000

[54] PRINTED CIRCUIT BOARD AND CHIP-ON-BOARD PACKAGES USING SAME

[75] Inventors: Bo Hyun Shin, Chungcheougnam-do; Min Cheol An, Kyungki-do, both of Rep. of Korea

[73] Assignee: Samsung Electronics Co., Ltd., Suwon, Rep. of Korea

[21] Appl. No.: 09/087,903

[22] Filed: May 1, 1998

[30] Foreign Application Priority Data

Jul. 3, 1997 [KR] Rep. of Korea ............. 97-30871

[51] Int. Cl.[7] ............. A01L 23/28; A01L 23/02; A01L 23/495; A01L 23/48; A01L 23/52

[52] U.S. Cl. ............. 257/787; 257/678; 257/667; 257/773

[58] Field of Search ............. 257/667, 678, 257/787, 690, 773

[56] References Cited

U.S. PATENT DOCUMENTS

| | | | |
|---|---|---|---|
| 4,814,943 | 3/1989 | Okuaki | 257/787 |
| 5,175,612 | 12/1992 | Long et al. | 257/667 |
| 5,847,458 | 12/1998 | Nakamura et al. | 257/787 |

FOREIGN PATENT DOCUMENTS

| | | | |
|---|---|---|---|
| 3-1540 | 1/1991 | Japan . | |
| 404239160 | 8/1992 | Japan | 257/667 |
| 404290252 | 10/1992 | Japan | 257/667 |

*Primary Examiner*—David Hardy
*Assistant Examiner*—Jesse A. Fenty
*Attorney, Agent, or Firm*—Jones Volentine, LLP

[57] ABSTRACT

A printed circuit board (PCB) for use in chip-on-board (COB) packages reduces failures due to warping of the COB packages. The PCB includes a board body having a upper surface and a lower surface, a chip bonding area on the upper surface for attaching a semiconductor device, and a plurality of conductors in a circuit pattern on the upper surface outside the chip bonding area, for electrical connection to the semiconductor device using a plurality of bonding wires. An encapsulation region encloses the chip bonding area, the bonding wires, a portion of the plurality of conductors, and a portion of the upper surface. The board includes external contacts on the lower surface for electrical connections to an external electrical appliance, and via holes through the board body for electrically connecting the plurality of conductors in the circuit pattern to the external contacts. A plurality of volume-adjusting regions, on the upper surface outside the chip bonding area and inside the encapsulation region, adjust a volume of a molding compound in the final package.

11 Claims, 12 Drawing Sheets

PRINTED CIRCUIT BOARD AND CHIP-ON-BOARD PACKAGES USING SAME

BACKGROUND OF THE INVENTION

1. Field of the Invention

The present invention relates generally to a printed circuit board (PCB) for use in chip-on-board (COB) packages and the COB packages using the same. More particularly, the present invention relates to a PCB which has protrusions or trenches within an encapsulation region on the PCB in order to prevent warping of the COB package after the encapsulation process.

2. Description of the Related Arts

As semiconductor integrated circuit devices become more complex and achieve greater speed and functionality, larger numbers of input/output (I/O) pins are required to realize the enhanced performance parameters of the new designs. At the same time, however, the overall size of the devices must continually be reduced to meet the need for employment in smaller and smaller electronic devices. To meet these conflicting needs of higher pin densities in smaller areas, so-called chip-on-board (COB) packages have been developed. In COB packages, a semiconductor integrated circuit device (IC) is directly mounted on a printed circuit board (PCB), thereby eliminating the need to construct a separate lead frame for connection to the device.

COB packages are heavily used for memory cards. As is well-known, memory cards have been developed for many uses such as storing captions, sounds, or static images generated by electronic entertainment equipment and digital still cameras, as substitutes for hard disks of computers, and as components of portable information storage and retrieval devices. By packaging several memory chips onto a single board, memory cards can attain a large storage capacity.

Memory cards include miniature cards, compact flashes, and SmartMedia. Among these, miniature cards and compact flashes suffer from high overhead cost and bulky size because both require built-in controllers.

Integrated circuit (IC) cards such as SmartMedia or solid state floppy disc cards (SSFDC), which are used for storing digital signals, contain COB packages with built-in flash memory chips. These IC cards enjoy advantages over earlier memory cards, including smaller size, good portability, and the ability to easily expand or upgrade the memory capacity without having to change the I/O pin name conventions. SmartMedia is used for storing information from, for example, digital still cameras or personal digital assistants (PDAs), and may be used in either an internal or removable mode. Moreover, SmartMedia is expected to be used more extensively in the future for a wide range of applications since it has a greater storage capacity than floppy diskettes or ID cards using a magnetic strip or tape, and is easy to store and handle.

The conventional PCB utilized in COB packages is described with reference to a plan view in FIG. 1. The conventional PCB 10 consists of thin board body 11 made from a glass-epoxy resin or BT (Bismaleimide Triazine) resin. A circuit pattern of conductors 13, which serve as electrical signal transmission pathways, is formed in the upper surface of the PCB, for example by using a copper foil and etching process. The bottom surface of the PCB is also provided with a pattern of conducting material which serves as a set of external contacts 15 as shown in FIG. 3. The conductors 13 of the circuit pattern in the upper surface of the PCB 10 are electrically connected to corresponding external contacts 15 by way of via holes 16 in the board body 11.

The circuit pattern of conductors 13, the external contacts 15, and the inner wall of the via holes 16 are coated with a conductive plating material, for example gold (Au) which does not suffer oxidation. A chip bonding area 12 is also formed on the upper surface of the board body 11. Usually, a cavity is produced in the bonding area 12 to reduce the thickness of the board body 11 where the chip will be attached and thus reduce the overall height of the finished package.

The PCB 10 is usually manufactured in the form of a strip like a conventional lead frame strip. On the strip, each individual PCB 10 is linked to guide rails 19 by way of tie bars 18.

FIG. 2 and FIG. 3 depict the conventional COB package 100 employing the PCB 10 described above. The COB package 100 includes a semiconductor chip 20, a conventional PCB 10, bonding wires 22 and an encapsulant 23. The chip 20 is attached to the chip bonding area 12 on the upper surface of the PCB 10, and the chip 20 is electrically connected to the circuit pattern of conductors 13 by using bonding wires 22 made from gold (Au) or aluminum (Al). Thus, the chip 20 which is electrically connected to conductors 13 of the circuit pattern via the bonding wires 22, is also electrically connected to the external contacts 15 formed on the lower surface of the PCB by way of the conductors 13 and the via holes 16. The upper surface of the PCB 10 within an encapsulation region is encapsulated with a molding compound, such as a thermosetting compound like epoxy resin, to form an encapsulant 23 which provides protection from external environmental stresses. The encapsulant 23 of the conventional COB package extends above the upper surface of the PCB and is usually formed using a transfer molding process.

In an exemplary memory chip configuration, the chip 20 on the chip bonding area 12 may be a flash memory chip having a storage capacity, for example, of 4 Megabytes (M), 16 M or 32 M. In general, the size of a flash memory chip increases with its storage capacity. For example, a 4 M flash memory chip has a size of about 116.1 mm×269.1 mm, where mm denotes a millimeter, a 16 M chip has a size of about 196.5 mm×444.7 mm, and a 32 M chip has a size of about 294.5 mm×514.7 mm. The dimension of the chip bonding area 12 varies according to the size of the chip 20 to be attached to it.

The COB package 100 retains the same pin name conventions among the versions using different flash memory chips so that an appliance using the COB package 100 can be easily expanded or upgraded by interchanging cards. Therefore, the structure of the base card on which the COB package 100 will be mounted must be uniform. Consequently, the shape or configuration of the PCB 10 also must be uniform, regardless of the size of the flash memory chip 20. Therefore it is necessary to be able to mount several kinds of flash memory chips, each with different capacity, onto a single sized and shaped PCB.

Since the shape of the COB package 100 should be uniform regardless of the size of the chip 20 mounted on the PCB 10 therein, the volume of molding compound such as epoxy resin employed for forming the encapsulant 23 of the COB package 100 becomes smaller as the chip size becomes larger. The COB package 100 having the smaller-sized 4 M chip, in which the largest volume of resin is incorporated to form the encapsulant, undergoes more warping than a COB package having the mid-sized 16 M chip. Similarly, the COB package 100 having the larger-sized 32 M chip, in which the smallest volume of resin is incorporated, also undergoes more warping than a COB package having the mid-sized 16 M chip—this time in an opposite direction.

Therefore, the volume of the molding resin must be balanced with the thermal expansion of the PCB, and with the other conditions of the molding process, in order to prevent failures of the COB package due to warping. However, it is not easy to balance the volumes and prevent such warping failures, because the encapsulant is constrained to have nearly uniform external dimensions while the chips within the encapsulant have different sizes. This situation forces the encapsulant to contain different volumes of molding compound.

Consequently, the COB package containing a 4 M flash memory chip usually undergoes warping in which the both ends of the PCB bend upward while the center part where the encapsulant is formed bends downward. By contrast, the COB package containing a 32 M flash memory chip undergoes warping in which the both ends of the PCB bend downward while the center part bends upward. Thus warping failures occur more often for COB packages with the smallest or largest memory chips, than for COB packages with a mid-sized memory chip.

Therefore there is a need for a COB package that reduces warping failures while varying memory chip sizes and simultaneously maintaining nearly uniform encapsulant external dimensions.

SUMMARY OF THE INVENTION

It is an object of the present invention to provide PCBs, and COB packages using those PCBs, which reduce warping failures in COB packages while varying memory chip capacities.

The printed circuit board of the present invention includes a board body having a upper surface and a lower surface, a chip bonding area on the upper surface for attaching a semiconductor device, and a plurality of conductors in a circuit pattern on the upper surface outside the chip bonding area, for electrical connections to the semiconductor device using a plurality of bonding wires. An encapsulation region encloses the chip bonding area, the bonding wires, a portion of the plurality of conductors, and a portion of the upper surface. The board includes external contacts on the bottom surface for electrical connections to an external electrical appliance, and via holes through the board body for electrically connecting the plurality of conductors in the circuit pattern to the external contacts. A plurality of volume-adjusting regions, on the upper surface outside the chip bonding area and inside the encapsulation region, adjust a volume of a molding compound in the final package.

BRIEF DESCRIPTION OF THE DRAWINGS

The present invention is described with reference to the accompanying drawings, in which like reference numerals designate like structural elements, and in which.

DETAILED DESCRIPTION OF THE INVENTION

Figure 1:
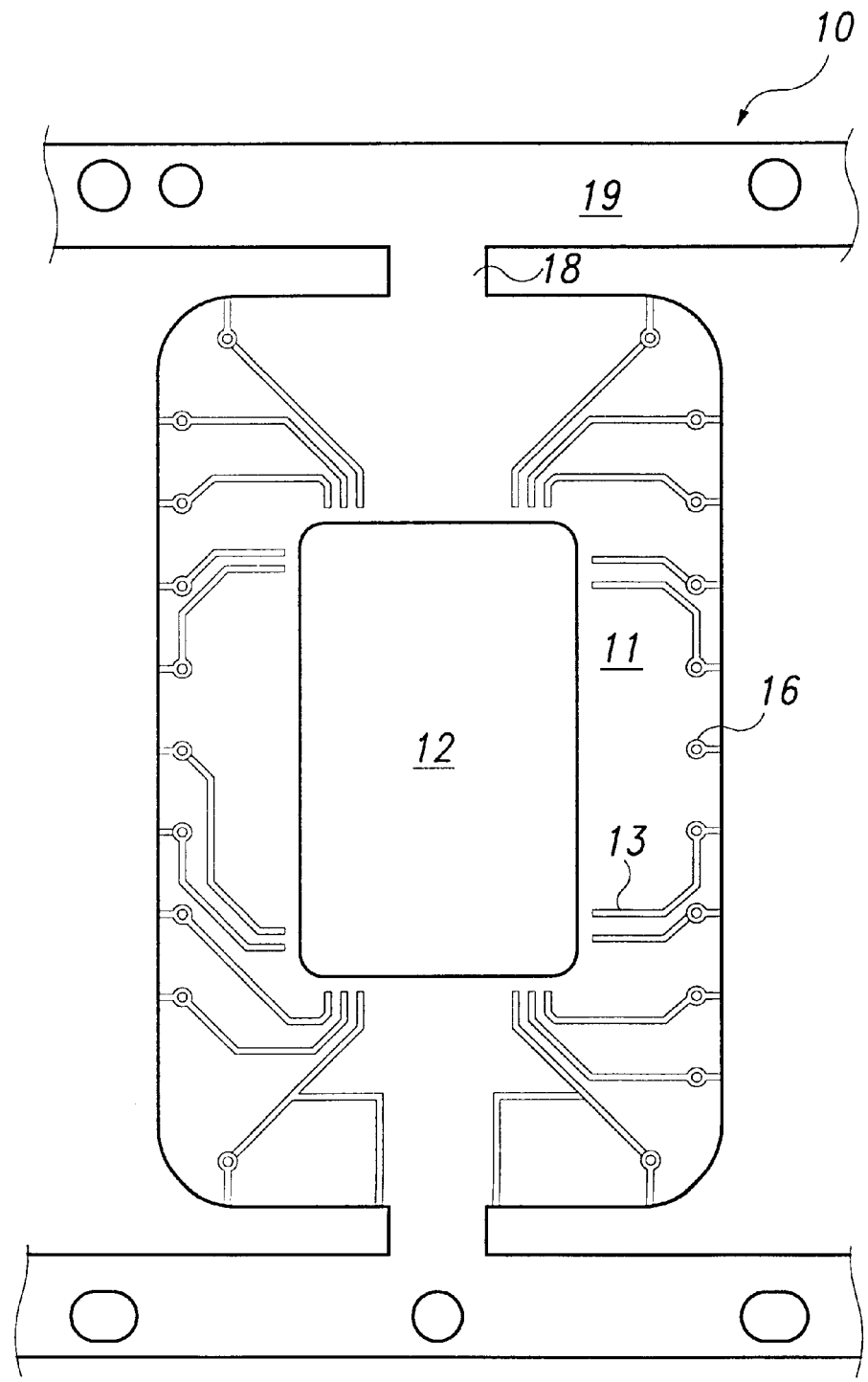
FIG. 1 is a plan view depicting the conventional printed circuit board (PCB) for chip-on-board (COB) packages.
Figure 2:
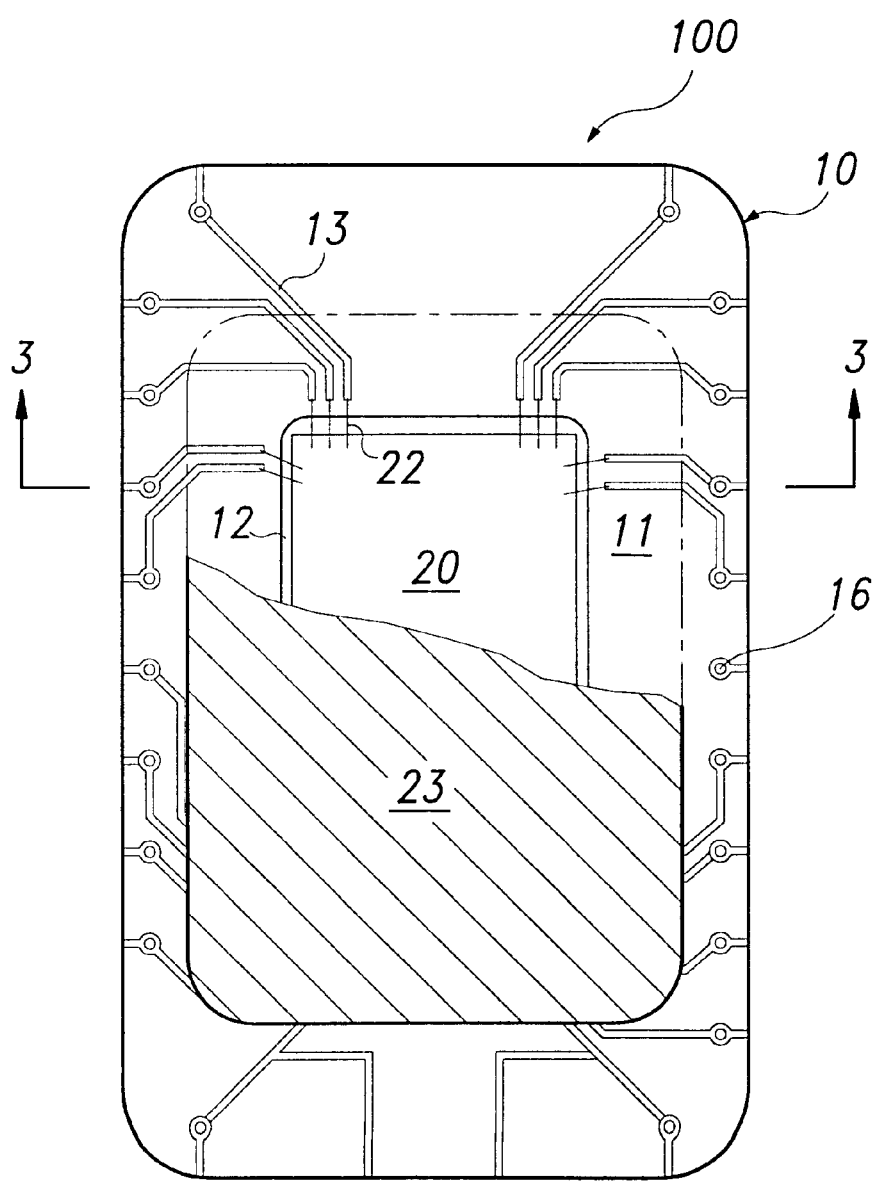
FIG. 2 is a partially cut-away plan view depicting a conventional COB package using the PCB in FIG. 1.
Figure 3:
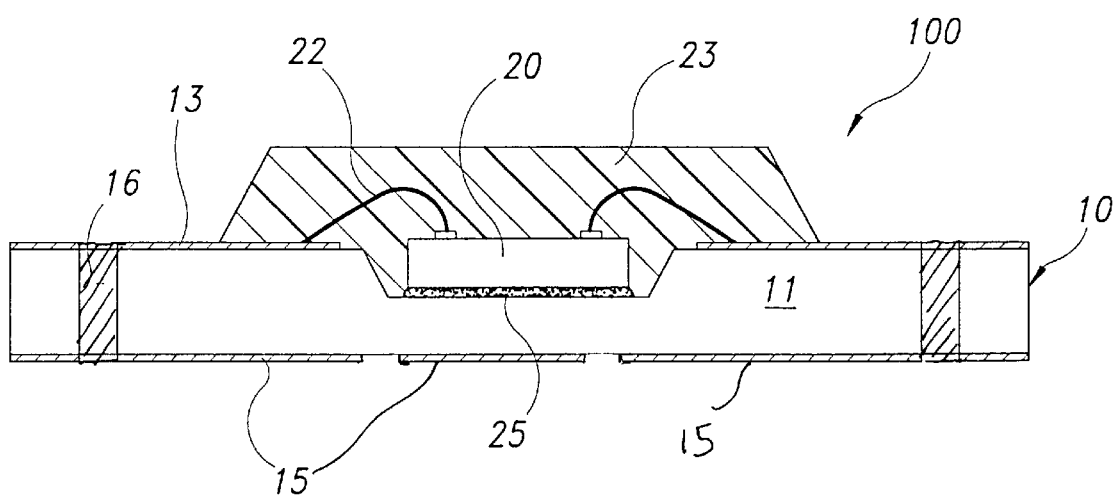
FIG. 3 is a cross-sectional view taken along the line 3—3 in FIG. 2.
Figure 4:
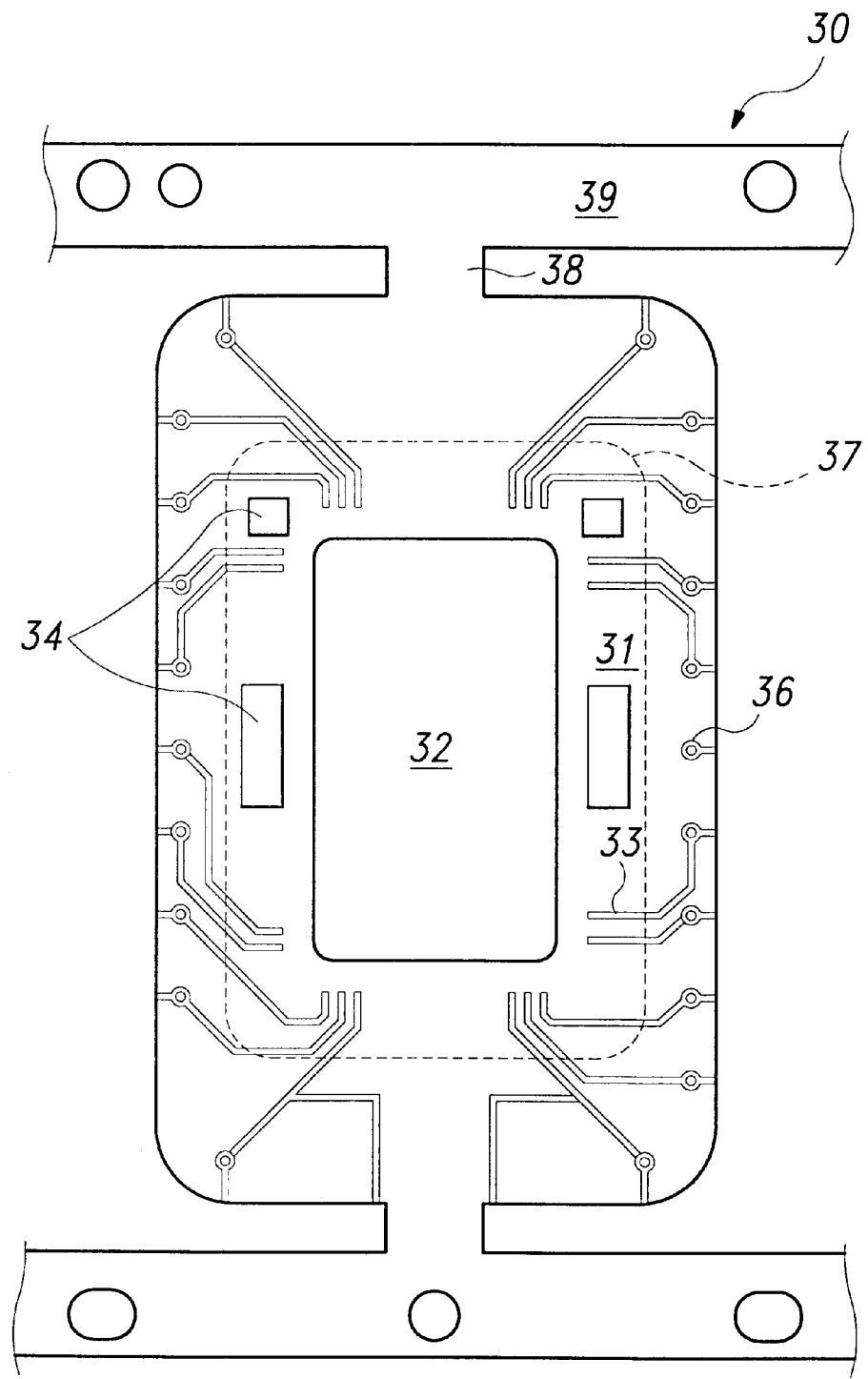
FIG. 4 is a plan view depicting a PCB for COB packages according to a first embodiment of the present invention, in which protrusions are formed in the upper surface of the PCB.
Figure 5:
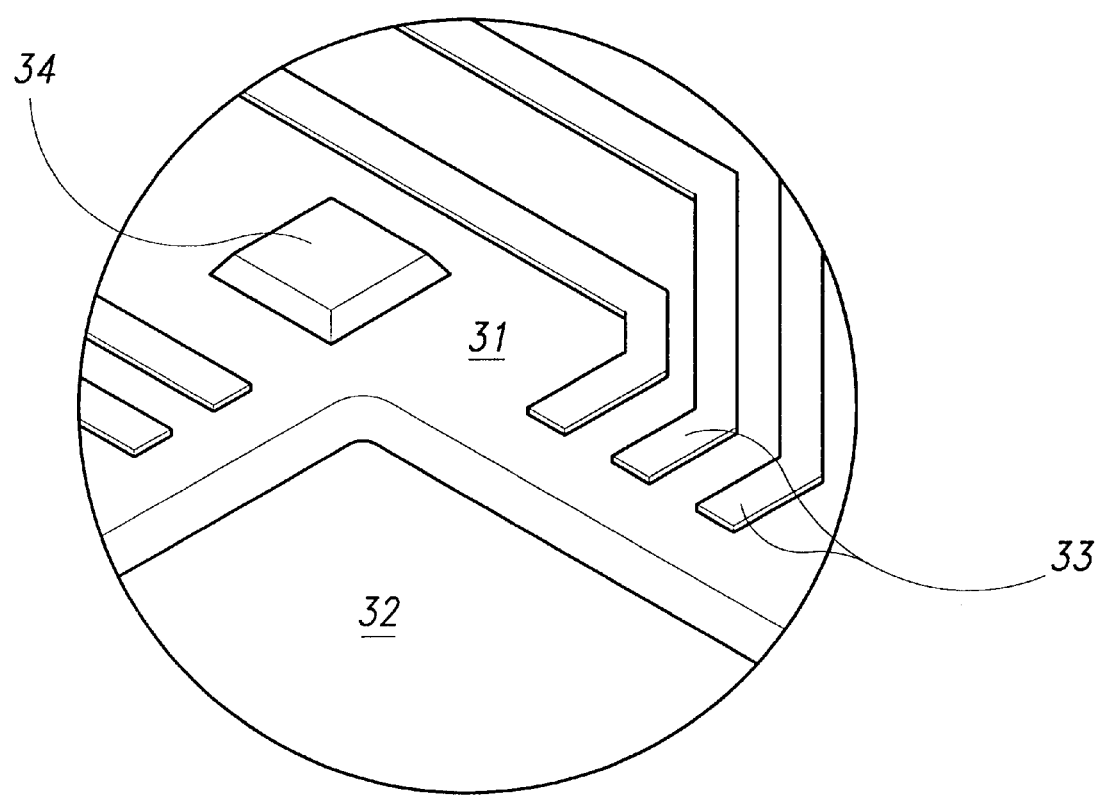
FIG. 5 is an enlarged perspective view of the protrusion portion of the PCB in FIG. 4.
Figure 6:
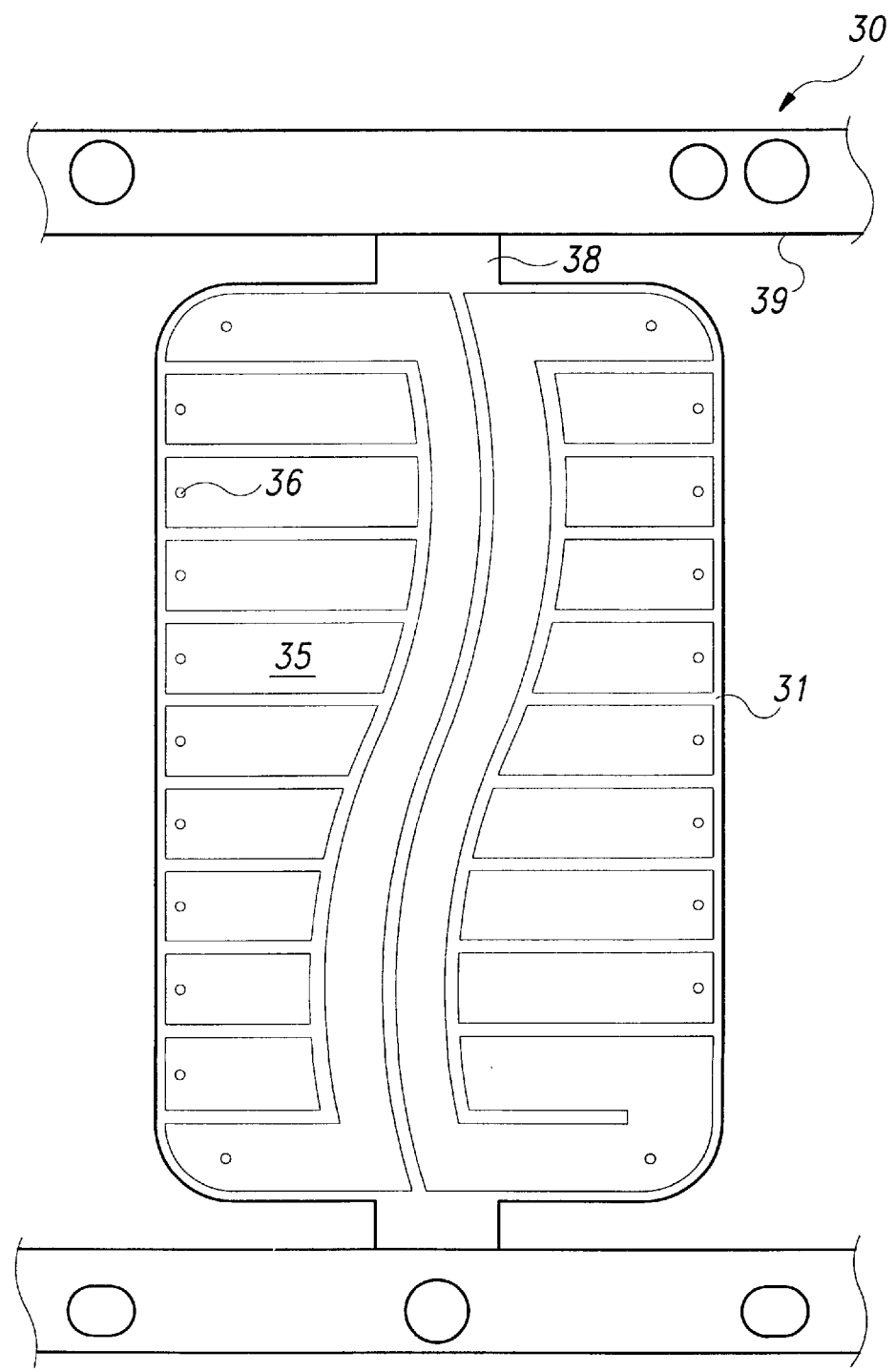
FIG. 6 is a plan view depicting the bottom surface of the PCB for the COB packages according to the present invention.

Referring to FIG. 4 through FIG. 6, the PCB 30 according to a first embodiment of the present invention is comprised of a board body 31 having upper and lower surfaces on which are arranged other components. A chip bonding area 32 and conductors 33 in a circuit pattern are provided on the upper surface as in the conventional PCB. External contacts 35 are provided on the lower surface, and via holes 36, provided along the peripheral parts of the board body 31, electrically connect the circuit patterns 33 to the external contacts. The PCB 31 of the present invention includes volume-adjusting regions arranged on the upper surface. In the embodiment of FIG. 4 and FIG. 5, the volume-adjusting regions are composed of protrusions 34, which are described in greater detail later.

The chip bonding area 32 is the region where the semiconductor device will be attached, as in the conventional PCB. In the preferred embodiment, the chip bonding area 32 is formed as a cavity in order to reduce the overall height of the finished COB package; and the cavity is recessed a predetermined depth from the upper surface of the board body 31 by a milling process. The circuit pattern conductors 33 are designed to be electrically connected to the semiconductor device attached to the chip bonding pad 32 and act as electrical signal pathways. In the preferred embodiment, the conductors 33 are formed by applying a copper foil to the upper surface of the board body 31 and then performing photo etching.

The external contacts 35 formed on the lower surface of the board body 31 are designed to be electrically connected to some external electronic appliance, for example, a set of external terminals. The configuration of the lower surface of the PCB 30 in the preferred embodiment is depicted in FIG. 6. Each of the external contacts 35 on the lower surface of the board body 31 is electrically connected to a corresponding conductor 33 of the circuit pattern on the upper surface by way of the via holes 36. Accordingly, electrical signals are transmitted between the semiconductor chip (not shown) and the external appliance (not shown) by way of the circuit conductors 33, the via holes 36, and the external contacts 35. The circuit pattern conductors 33 and the external contacts 35 may be covered with a plating of an electrically conductive material, such as gold (Au) or nickel (Ni), to prevent oxidation.

In the preferred embodiment the PCB 30 is manufactured in sets that form a strip, like the lead frame strip used in the manufacture of separate plastic semiconductor packages, to increase the automation of the package assembly process. Thus, in the preferred embodiment, individual PCBs 30 are coupled together by a guide rail 39 connected by tie bars 38. For example, the PCB strip may comprise a pair of guide rails 39 with six PCBs 30 disposed therebetween, which are spaced at equal intervals and connected to the guide rails 39 by the tie bars 38. The guide rails 39 are provided with holes for indexing and moving the PCBs through the fabrication process.

As described previously, a feature of the present invention is the presence of volume-adjusting regions on the upper surface of the board body 31. In the first embodiment as shown in FIG. 4 and FIG. 5 for use with smaller chips, the board body 31 is provided with protrusions 34 on its upper surface. The protrusions 34 are positioned on the upper surface outside the chip bonding area 32 and inside an encapsulated region indicated by the dotted line 37. The protrusions, which are spaced apart from the conductors 33 of the circuit pattern, rise above the level defined by the upper surface of the PCB outside the encapsulation region. Such a PCB 30 having the protrusions 34 is employed for the manufacture of a COB package containing a small-sized semiconductor device, for example, a 4M flash memory chip.

The protrusions 34 replace a portion of the encapsulant 43 (FIG. 8) in the encapsulating region, thereby providing less encapsulant in that area. Using routine force or stress evaluation techniques available to those of ordinary skill in the art, one could determine the location and extent of warpage of a particular conventional chip. Preferably, the protrusions 34 are formed at or near these locations to minimize the force or stress accordingly. Usually, the protrusion locations would be symmetrical about lateral and/or longitudinal axes of the chip, provided that such locations do not interfere with the circuit patterns formed on the upper surface of the PCB inside the encapsulation region.

Although square or rectangular shaped protrusions 34 are shown in FIG. 4 and FIG. 5, the protrusion shape is not limited thereto. A variety of protrusion shapes may be used to displace a designated amount of encapsulation to reduce the force or stress applied to an area of semiconductor device. Such shape selection and force calculations can be undertaken by those of ordinary skill in the art without undue experimentation and using conventional tools.

The protrusions 34 can be formed by any appropriate process. In the preferred embodiment, the protrusions 34 are formed by screen printing onto the upper surface of the PCB an electrically insulating resin such as photo solder resist (PSR) or a thermosetting epoxy resin. Alternatively, the protrusions may be formed as an integral part of the board body 31 during its manufacture.

Figure 7:
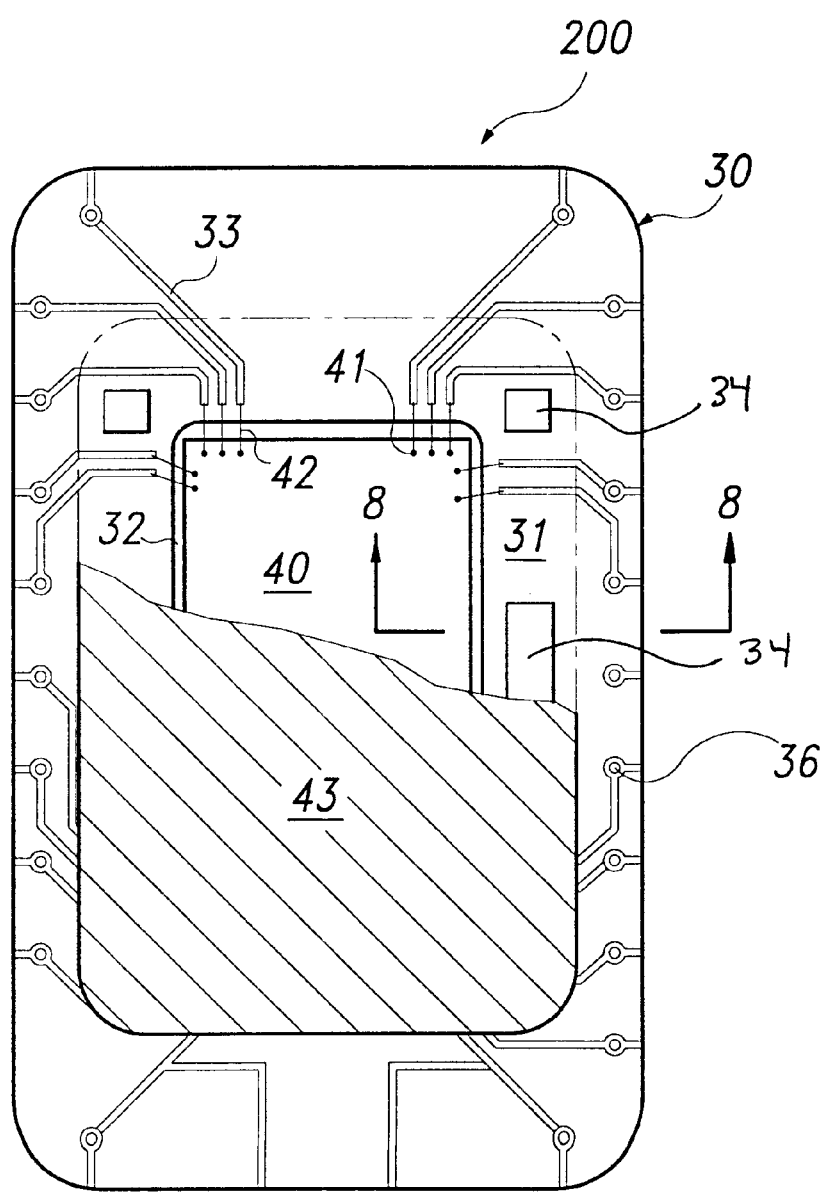
FIG. 7 is a partially cut-away plan view depicting a COB package employing the PCB from FIG. 4.
Figure 8:
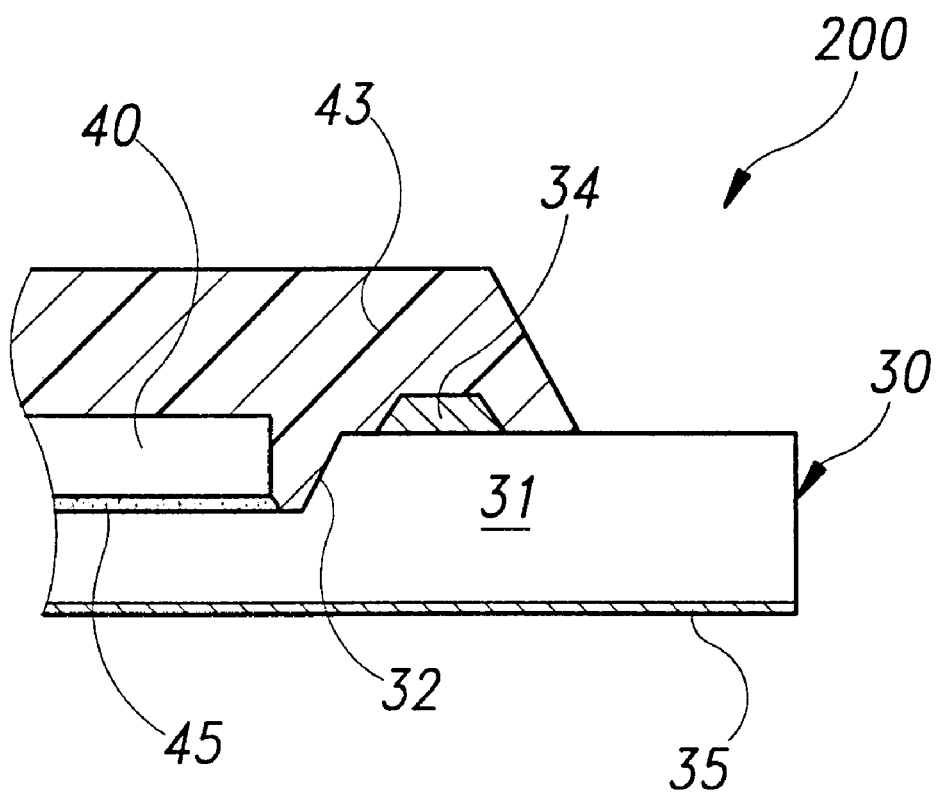
FIG. 8 is a cross-sectional view of the COB package taken along the line 8—8 in FIG. 7.

Referring to FIG. 7 and FIG. 8, a COB package 200 utilizing the above-described PCB 30 is depicted. The COB package 200 has a semiconductor device 40, a PCB 30, bonding wires 42, and an encapsulant 43. The semiconductor chip 40 is attached to the chip bonding area 32 on the upper surface of the board body 31 using an adhesive 45. The bonding pads 41 of the device 40 are electrically connected to the respective conductors 33 of the circuit pattern with the bonding wires 42. The PCB 30 has external contacts 35 on its lower surface, which are electrically connected to the conductors 33 of the circuit pattern by way of the via holes 36, the inner wall of which is plated with an electrically conductive material. Thus, the semiconductor device 40 is electrically connected not only to the conductors 33 of the circuit pattern, by way of the bonding wires 42, but also to the external contacts 35 by way of the via holes 36. An encapsulant 43 is formed on the upper surface of the board body 31 to cover the device 40, the bonding wires 42, the protrusions 34, and portions of the circuit patterns 33 and upper surface. In the preferred embodiment the encapsulant is made from a thermosetting resin such as an epoxy resin.

In the preferred embodiment, the COB packages 200 are formed on the strip of PCBs 30. As in the common assembly process used with separate plastic packages for semiconductor devices, a chip attach process, a wire bonding process, and an encapsulation process are executed in sequence. After the encapsulation process, individual COB packages 200 are separated from the strip 39 (FIG. 4) by cutting the tie bars 38 (FIG. 4).

With this embodiment of the present invention, since the protrusions 34 are provided inside the encapsulation region 37 (FIG. 4) and outside the chip bonding area 32, the volume of the molding resin acting on the device 40 is reduced compared to the conventional COB having the same sized device, and thus fewer warping failures occur.

Thereafter, the above-described COB package 200 is mounted to a base card to manufacture, for example, a SmartMedia device. For this purpose, the COB package 200 is mounted to the base card so the chip faces the base card, and the lower surface of the PCB 30 is exposed. Therefore, the SmartMedia device can be electrically connected to an external electronic appliance by way of the external contacts 35 on the lower surface of the PCB 30.

Figure 9:
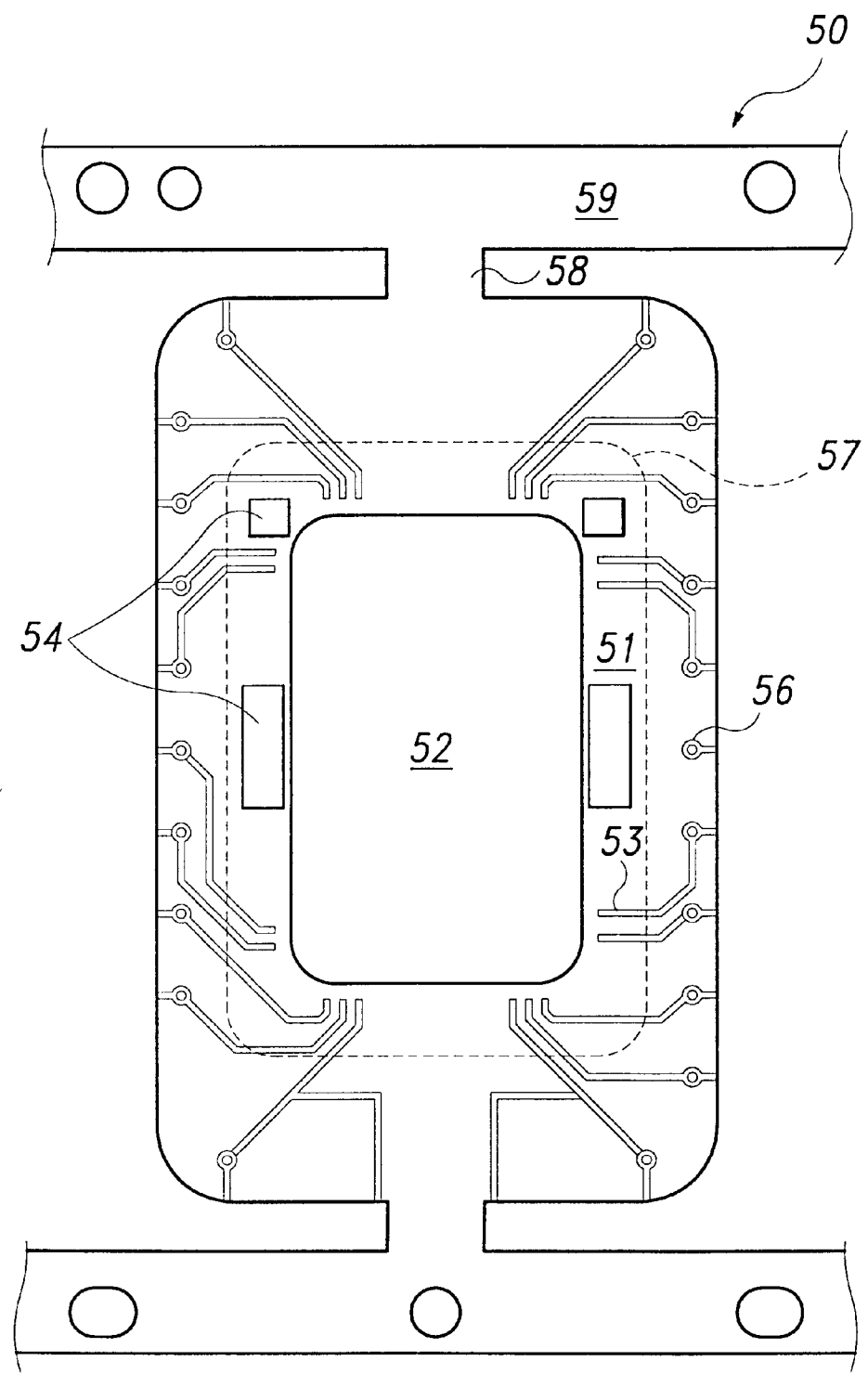
FIG. 9 is a plan view depicting a PCB for COB packages according to a second embodiment, in which trenches are formed in the upper surface of the PCB.
Figure 10:
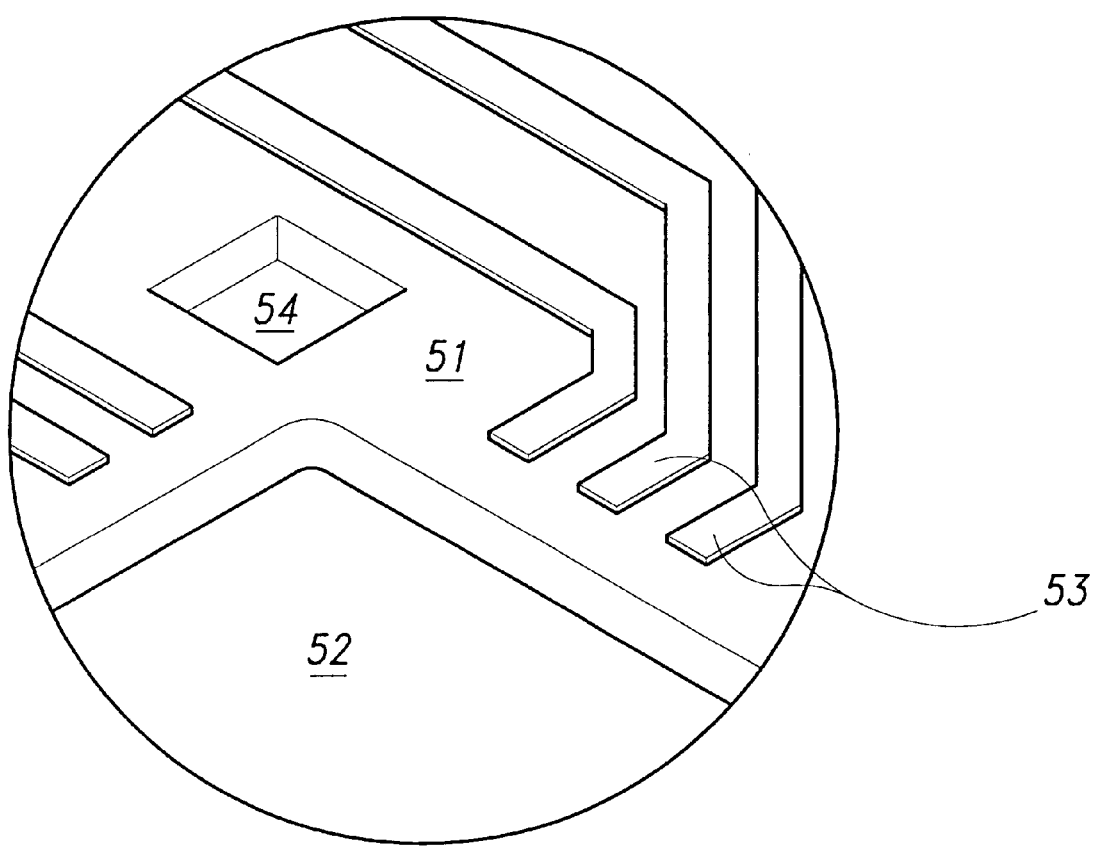
FIG. 10 is an enlarged perspective view of the trench portion of the PCB in FIG. 9.

Referring to FIG. 9 and FIG. 10, a PCB 50 according to a second embodiment of the present invention for a PCB is depicted. This PCB 50 is for use in manufacture of a COB package containing a relatively large-sized chip, like a 32 M flash memory chip. As in the prior embodiment, the chip bonding area 52 and circuit pattern conductors 53 are also provided on the upper surface of the board body 51. The external contacts 55 (FIG. 12) are provided on the lower surface of the board body 51, and are electrically connected to the circuit pattern conductors 53 by way of the via holes 56 formed through the board body 51.

Unlike the prior embodiment, the volume-adjusting regions of this PCB 50 embodiment consist of trenches 54, such as grooves or furrows, on the upper surface of the board body 51. The trenches 54 are provided inside the encapsulation region 57 and outside the chip bonding area 52. The trenches, which are spaced apart from the conductors 53 of the circuit pattern, are recessed below the level defined by the upper surface outside the encapsulation region.

The trenches 54 allow for a greater amount of encapsulant 63 (FIG. 12) to be provided in that particular portion of the encapsulating region. As with the previous embodiment, using routine force or stress evaluation techniques available to those of ordinary skill in the art, one could determine the location and extent of warpage of a particular chip. Preferably, the trenches 54 are formed at or near these locations to provide greater force or stress accordingly. Usually, the trench locations would be symmetrical about lateral and/or longitudinal axes of the chip, provided that such locations do not interfere with the circuit patterns formed on the upper surface of the PCB inside the encapsulation region.

Although square or rectangular shaped trenches 54 are shown in FIG. 9 and FIG. 10, the trench shape is not limited thereto. A variety of trench shapes may be used to increase the amount of encapsulant in an area to increase the force or stress applied to an area of the semiconductor device. Such shape selection and force calculations can be undertaken by those of ordinary skill in the art without undue experimentation and using conventional tools.

The trenches 54 can be made by any appropriate process, for example, by the same cavity process for forming the chip bonding area 52. In the preferred embodiment for the larger chip, the upper surface of the board body 51 is milled to form the trenches 54 when the chip bonding area 52 is formed.

Figure 11:
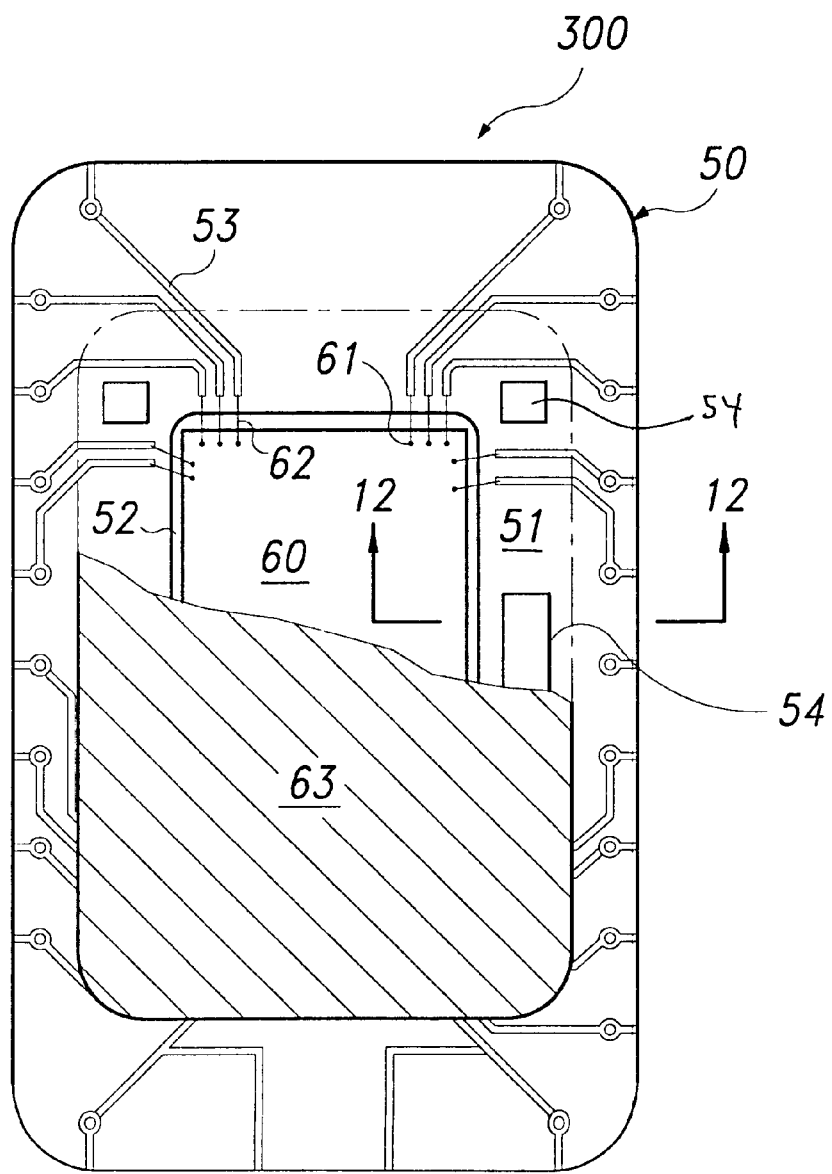
FIG. 11 is a partially cut-away plan view depicting a COB package employing the PCB from FIG. 9.
Figure 12:
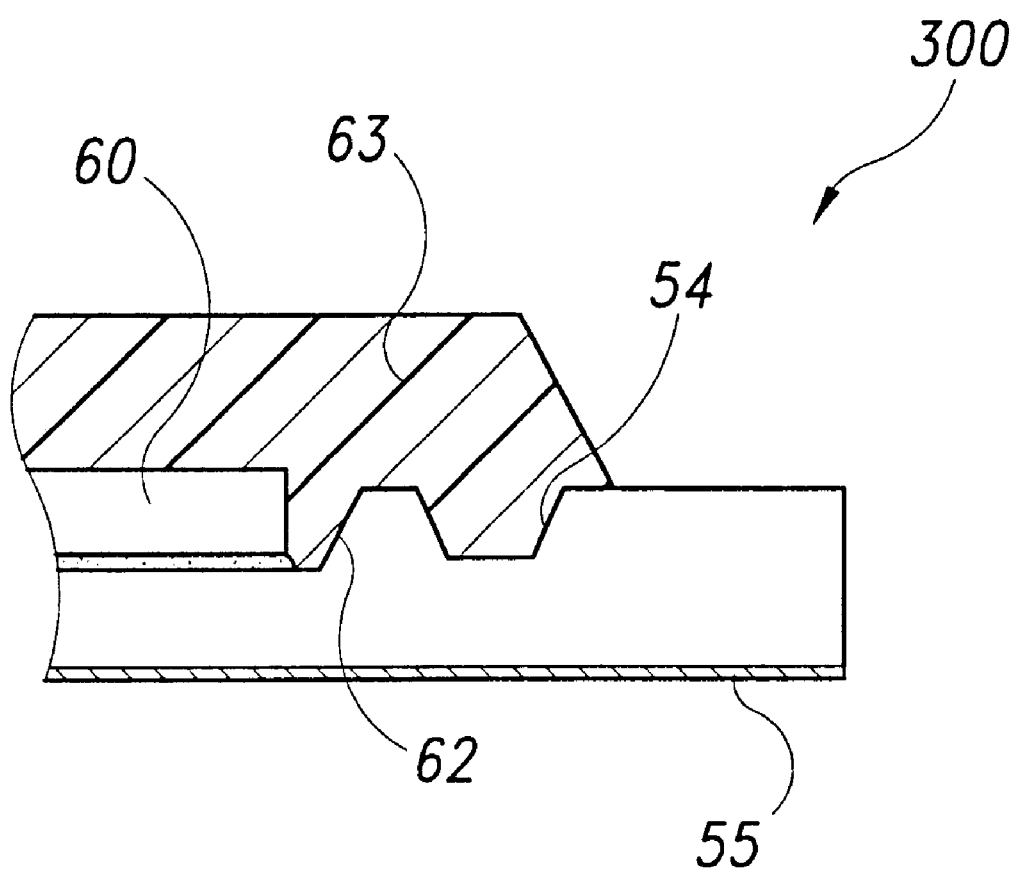
FIG. 12 is a cross-sectional view of the COB package taken along the line 12—12 in FIG. 11.

The COB package 300 using the PCB 50 of this embodiment is depicted in FIG. 11 and FIG. 12. Its structure and electrical interconnection are the similar to that of the COB 200 in FIG. 7, except that trenches 54 are provided instead of protrusions 34, and the trenches are filled with the molding compound.

Accordingly, the extra volume of the molding compound required to fill the trenches 54 compensates for the reduced volume of molding compound ordinarily used to form the encapsulant 63 when a large-sized semiconductor device 50 is mounted on the chip bonding area 52.

Referring to FIG. 7 and FIG. 11, the two embodiments of the COB packages can be compared. The COB package 200 of FIG. 7 and the COB package 300 of FIG. 11 have the same external configuration, i.e., they have the same pin name convention for the external contacts 35 and 55, and they have the same external dimensions for the encapsulant 43 and 63. However, they are different from each other in that the COB package 200 comprises the smallest semiconductor device 40, such as the 4 M flash memory chip, and the PCB 30 with the protrusions 34. On the other hand, the COB package 300 comprises the larger-sized semiconductor device 60, such as a 32M flash memory chip, and the PCB 50 with the trenches 54. Also, although not drawn to scale in FIG. 7 and FIG. 11, another difference is that the chip bonding area 32 of the COB package 200 using the first embodiment is smaller than the chip bonding area 52 of the COB package 300 using the second embodiment.

Therefore, according to the present invention, by providing the PCB with volume-adjusting regions such as protrusions or trenches on its upper surface, when a semiconductor device is mounted and an encapsulant covering is formed, the amount of the molding resin used for forming the encapsulant can be decreased or increased, as needed to prevent warping failures of the COB packages.

Although example and preferred embodiments of the present invention have been described in detail, it should be clearly understood that many variations and modifications of the basic invention taught here may appear to those skilled in the art and will still fall within the spirit and scope of the present invention as defined in the appended claims and their equivalents.

What is claimed is:

1. A printed circuit board for use in manufacturing chip-on-board packages, comprising:
    a board body having an upper surface and a lower surface;
    a chip bonding area on the upper surface for accommodating a semiconductor chip;
    a plurality of conductors in a circuit pattern on the upper surface outside the chip bonding area, for electrical connection to the semiconductor chip using a plurality of bonding wires;
    external contacts on the lower surface for electrical connection to an external electrical appliance;
    via holes extending through the board body for electrically connecting the plurality of conductors in the circuit pattern to the external contacts; and
    a plurality of protrusions extending upwardly from the plane of the upper surface of said board body at locations outside said chip bonding area but within an encapsulation region, which is to be covered by an encapsulant molded to the board body, said encapsulating region encircling said chip bonding area, a portion of said upper surface, and only inner end portions of said plurality of conductors, said protrusions being pre-designed to regulate the volume of molding compound used to form the encapsulant to one which will not cause the chip to warp during the molding process of forming the encapsulant.

2. The printed circuit board of claim 1, wherein the plurality of protrusions are composed of an electrically insulating resin.

3. A printed circuit board for use in manufacturing chip-on-board packages, comprising:
    a board body having an upper surface and a lower surface;
    a chip bonding area on the upper surface for accommodating a semiconductor device;
    a plurality of conductors in a circuit pattern on the upper surface outside the chip bonding area, for electrical connection to the semiconductor device using a plurality of bonding wires;
    external contacts on the lower surface for electrical connection to an external electrical appliance;
    via holes extending through the board body for electrically connecting the plurality of conductors in the circuit pattern to the external contacts; and
    a plurality of trenches extending into said board body at locations outside said chip bonding area but within an encapsulation region which is to be covered by an encapsulant molded to the board body, said encapsulating region encircling said chip bonding area, a portion of said upper surface, and only inner end portions of said plurality of conductors, said trenches being pre-designed to regulate the volume of molding compound used to form the encapsulant to one which will not cause the chip to warp during the molding process of forming the encapsulant.

4. The printed circuit board of claim 3, wherein the plurality of trenches are formed in the upper surface by a milling process.

5. A chip-on-board package comprising:
    a semiconductor device having a plurality of bonding pads on an active surface;
    a printed circuit board comprising
        a board body having an upper surface and a lower surface,
        a chip bonding area at which the semiconductor device is attached,
        a plurality of conductors in a circuit pattern on the upper surface outside the chip bonding area,
        external contacts on the lower surface for electrical connection to an external electrical appliance,
        vias extending through the board body and electrically connecting the plurality of conductors in the circuit pattern to the external contacts, and
        a plurality of protrusions extending above the plane of the upper surface of said board body at locations outside of said chip bonding area but within an encapsulation region;
    a plurality of bonding wires electrically connecting the plurality of bonding pads to the plurality of conductors; and
    an encapsulant molded to said board body and covering said encapsulation region of the printed circuit board, the encapsulant encapsulating the semiconductor device and the plurality of bonding wires, wherein said protrusions are pre-designed to regulate the volume of molding compound used to form the encapsulant to one which prevents the chip from warping during the molding process of forming the encapsulant.

6. The chip-on-board package of claim 5, wherein said encapsulant is comprised of a thermosetting resin.

7. The chip-on-board package of claim 5, wherein the semiconductor device is a 4M flash memory chip.

8. The chip-on-board package of claim 5, wherein the plurality of protrusions are composed of an electrically insulating resin.

9. A chip-on-board package comprising:

a semiconductor device having a plurality of bonding pads on an active surface;

a printed circuit board comprising
   a board body having an upper surface and a lower surface,
   a chip bonding area at which the semiconductor device is attached,
   a plurality of conductors in a circuit pattern on the upper surface outside the chip bonding area,
   external contacts on the lower surface for electrical connection to an external electrical appliance,
   vias extending through the board body and electrically connecting the plurality of conductors in the circuit pattern to the external contacts, and
   a plurality of trenches extending into the upper surface of the board body at locations outside said chip bonding area but within an encapsulation region;

a plurality of bonding wires electrically connecting the plurality of bonding pads to the plurality of conductors; and an encapsulant molded to said board body and covering said encapsulation region of the printed circuit board and filling said trenches, the encapsulant encapsulating the semiconductor device and the plurality of bonding wires, wherein said trenches are pre-designed to regulate the volume of molding compound used to form the encapsulant to one which prevents the chip from warping during the molding process of forming the encapsulant.

10. A chip-on board package of claim 9, wherein the semiconductor device is a 32M flash memory chip.

11. The chip-on-board package of claim 9, wherein the plurality of trenches are formed in the upper surface by a milling process.

* * * * *